United States Patent [19]

Bock

[11] 4,234,802
[45] Nov. 18, 1980

[54] CURRENT LIMITER

[75] Inventor: Francis X. Bock, New Hyde Park, N.Y.

[73] Assignee: Kollmorgen Technologies Corporation, Dallas, Tex.

[21] Appl. No.: 941,011

[22] Filed: Sep. 11, 1978

[51] Int. Cl.³ .................................... H04B 15/00
[52] U.S. Cl. .................... 328/171; 307/237; 308/168
[58] Field of Search ............... 307/237; 328/168, 169, 328/171; 318/635; 330/127, 129, 278, 273

[56] References Cited

U.S. PATENT DOCUMENTS

| 3,684,940 | 8/1972 | Lutz | 318/635 |
| 3,772,604 | 11/1973 | Hogg et al. | 328/169 |
| 3,898,573 | 8/1975 | Sherman | 328/171 |

Primary Examiner—Stanley D. Miller, Jr.
Assistant Examiner—B. P. Davis
Attorney, Agent, or Firm—Morgan, Finnegan, Pine, Foley & Lee

[57] ABSTRACT

Method and apparatus for independently, adjustably limiting both the peak current and average current in a switching servo amplifier.

5 Claims, 1 Drawing Figure

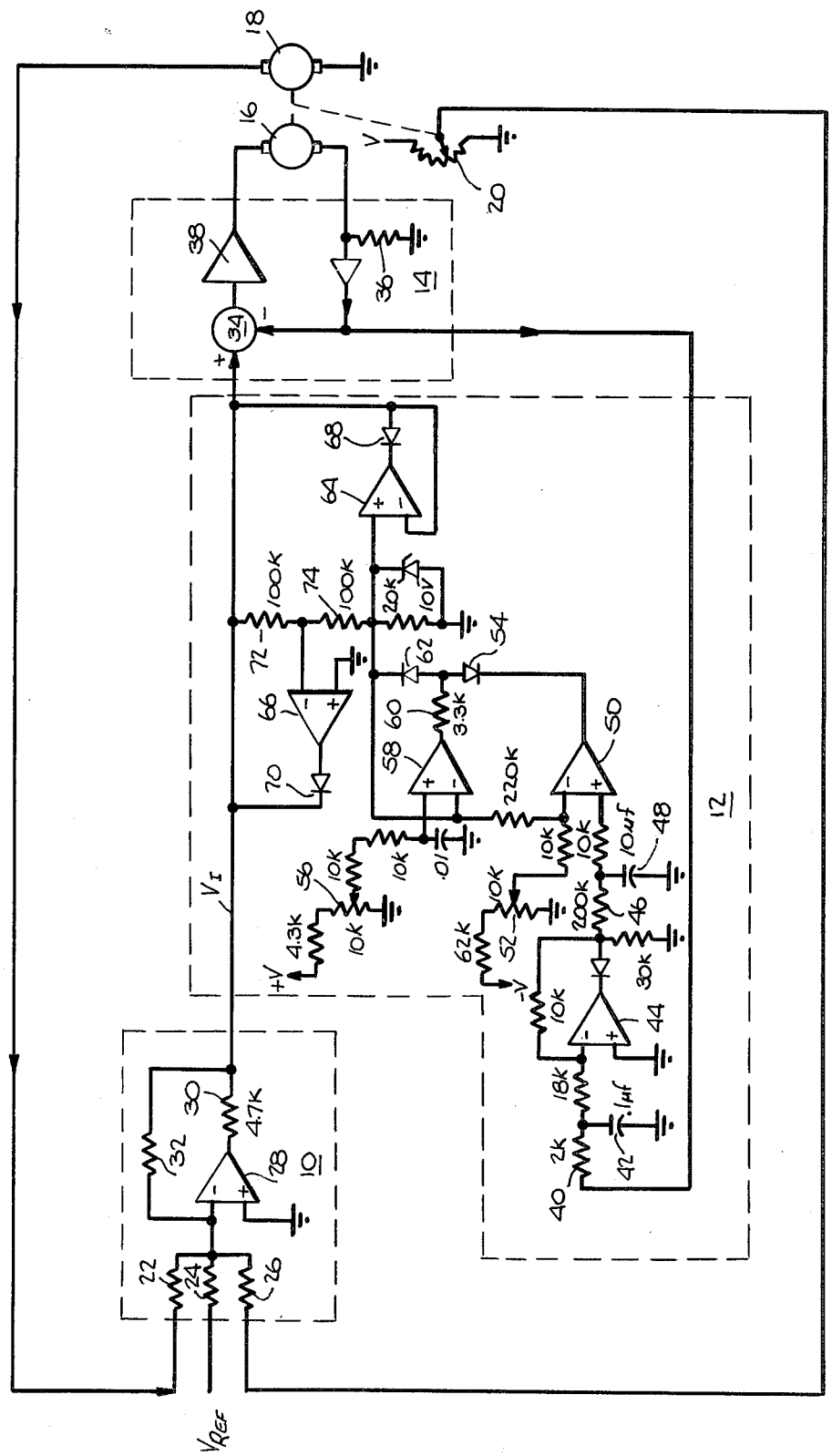

CURRENT LIMITER

BACKGROUND AND BRIEF DESCRIPTION OF THE INVENTION

The present invention relates to current limiters for transistorized power amplifiers and, more particularly, to current limiters for switching servo amplifiers typically designed to provide ±75 V at ±10 A to drive DC servo motors.

Transconductance amplifiers are universally used in switching servo amplifiers. The transconductance amplifier acts to force motor current to be directly proportional to input voltage. To protect both the motor and the amplifier, the input voltage is limited to some maximum value. One simple way of limiting the input voltage is by means of two back-to-back series-connected zener diodes connected between the amplifier input and ground. This limits the input voltage to $\pm V_Z$, $V_Z$ being the zener breakdown voltage (neglecting forward diode voltage drops). In this manner, the current is also limited, the current being proportional to the input voltage. While this is one possible method of current limiting, it is undesirable because it does not differentiate between current peaks which occur closely spaced in time and those which occur widely spaced in time.

To obtain rapid motor acceleration and maximum motor performance it is often desirable to allow relatively high peak currents for short time periods. DC motors having low inductance (e.g., printed circuit) armatures can accept and respond to large current pulses of very short duration. Current limiters which do not permit high peak currents for relatively short periods, therefore, effectively degrade motor performance. Conversely, current limiters which permit high current peaks regardless of their frequency of occurrence also permit excessive continuous currents which could damage or destroy both the amplifier and the motor.

The present invention overcomes these deficiencies by independently, adjustably limiting both the peak and average current in a switching servo amplifier. The amplifier current is monitored and, when the average current is low, large peak currents are passed to the motor. When the average current is high, however, the large current peaks are limited. In all cases, however, the maximum peak current is limited.

BRIEF DESCRIPTION OF THE DRAWING

The FIGURE is a simplified schematic diagram of one embodiment of the current limiter of the present invention.

DETAILED DESCRIPTION

The FIGURE shows a position servo system. Other types of servo systems could also have been used to illustrate the present invention. The position servo comprises error circuit 10, current limiter 12, transconductance amplifier 14, motor 16, tachometer 18 and position transducer 20. Motor 16, tachometer 18 and position transducer 20 are mechanically linked together.

Error circuit 10 has three input summing resistors 22, 24 and 26 which sum, respectively, the tachometer output voltage, a reference voltage indicative of the desired position and the position transducer output voltage indicative of the actual position. The output of resistor 22, 24 and 26 is fed to operational amplifier 28. In series with the output of amplifier 28 is resistor 30. Feedback is provided by resistor 32.

The output of error circuit 10 is $V_I$ which is fed to one input of summing junction 34 in transconductance amplifier 14. The other input of summing junction 34 is a voltage proportional to the instantaneous current in motor 16 which is developed across current sensing resistor 36. The output of the summing junction is amplified by power amplifier 38. Power amplifier 38 typically comprises four output transistors operated in the switching mode and connected in an "H" or bridge configuration. See, e.g., "Drive Servos With A Switching Amplifier," *Electronic Design* 26, Dec. 20, 1977, pages 142–145.

As noted earlier, there are two aspects to the present invention. The first involves peak current limiting. The second involves average current limiting. Both will now be described.

The voltage developed across resistor 36 is directly proportional to the motor current. This voltage, however, typically contains ripple (e.g., at 5 KHz) from the power switching elements within transconductance amplifier 14. When the voltage across resistor 36 is introduced into current limiter 12 it is first filtered by resistor 40 and capacitor 42. After filtering the voltage is fed to operational amplifier 44 which, together with its associated components, forms an inverting, absolute value circuit. The output of the absolute value circuit, which is always negative, is fed to an averaging circuit formed of resistor 46 and capacitor 48. The output of the averaging circuit is fed to one input of amplifier 50. The other input to amplifier 50 is determined by variable resistor 52, which sets the average current limit.

Assuming that the output of the averaging circuit is more positive than the voltage set by resistor 52 (average current less than the average current limit), the output of amplifier 50 is saturated positive and diode 54 is reverse biased.

Variable resistor 56, which determines the voltage at the input of operational amplifier 58, sets the peak current limit. With diode 54 reverse biased, amplifier 58 is effectively connected as a voltage follower through resistor 60 and diode 62. Thus, the voltage at the cathode of diode 62, $V_c$, follows the voltage set by resistor 56.

The clamping circuit comprises operational amplifiers 64 and 66, together with their associated components, and resistor 30, indicated as forming a part of the error circuit 10. When $V_I$ is between $V_c$ and $-V_c$, the clamping circuit has no effect and $V_I$ is fed directly to transconductance amplifier 14. When $V_I$ attempts to exceed $\pm V_c$, however, it is clamped to $\pm V_c$.

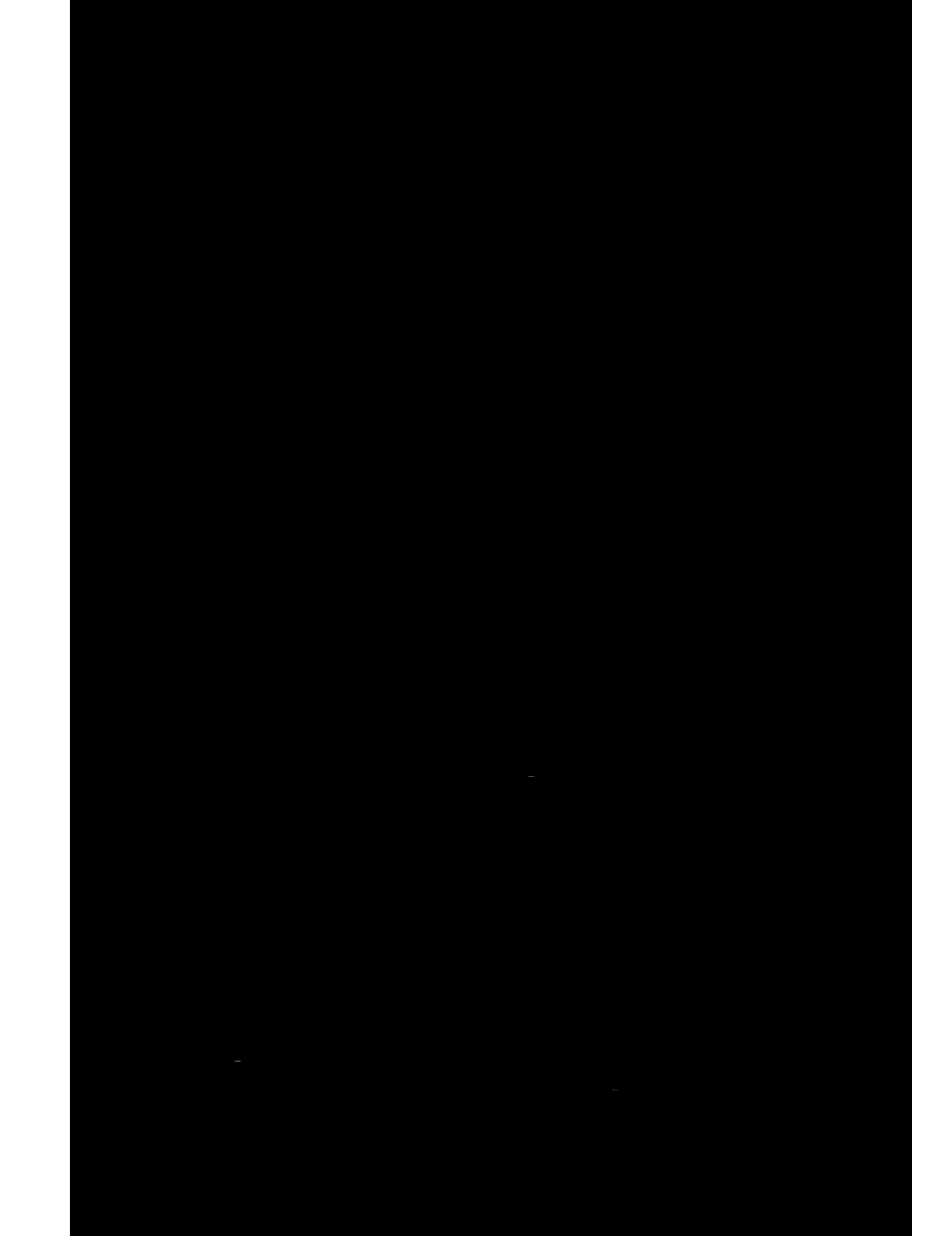

Assuming $V_I$ attempts to exceed $V_c$, the output of amplifier 64 will tend to become negative, thereby forward biasing diode 68. With diode 68 forward biased, amplifier 64 becomes a simple voltage follower and $V_I$ is forced to follow (is clamped to) $V_c$. The output of amplifier 28 rises to its positive saturation limit in an attempt to satisfy its feedback requirements. A voltage is developed across resistor 30, one side going to the positive saturation limit voltage of amplifier 28, the other side being clamped to $V_c$. The resultant current flows from resistor 30 through diode 68 and keeps diode 68 forward biased. Since both $V_I$ and $V_c$ are positive voltages, the inverting input of amplifier 66 is strongly positive. The output of amplifier 66 is thereby driven strongly negative and diode 70 is reverse biased. Amplifier 66 is thus isolated from $V_I$ and has no effect.